United States Patent
McBrien et al.

(10) Patent No.: US 11,112,444 B2
(45) Date of Patent: Sep. 7, 2021

(54) REDUCED ERROR SENSOR FAULT DETECTION

(71) Applicant: Hamilton Sundstrand Corporation, Charlotte, NC (US)

(72) Inventors: Gary M. McBrien, South Glastonbury, CT (US); James A. Gosse, Storrs, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 262 days.

(21) Appl. No.: 16/373,180

(22) Filed: Apr. 2, 2019

(65) Prior Publication Data

US 2020/0319238 A1 Oct. 8, 2020

(51) Int. Cl.
| | |
|---|---|
| *G01R 31/00* | (2006.01) |
| *B64F 5/60* | (2017.01) |
| *G01R 31/42* | (2006.01) |
| *B64D 45/00* | (2006.01) |

(52) U.S. Cl.
CPC .............. *G01R 31/008* (2013.01); *B64F 5/60* (2017.01); *G01R 31/42* (2013.01); *B64D 45/00* (2013.01)

(58) Field of Classification Search
CPC . G01R 1/00; G06N 3/00; H01M 4/00; H01M 2200/00; B60K 17/00
See application file for complete search history.

(56) References Cited

U.S. PATENT DOCUMENTS

| | | | |
|---|---|---|---|
| 7,271,595 B2 | 9/2007 | Shimizu et al. | |
| 8,599,523 B1* | 12/2013 | Ostrovsky | G01R 31/52 361/45 |
| 2013/0128396 A1* | 5/2013 | Danesh | H02H 3/006 361/45 |
| 2014/0062500 A1* | 3/2014 | Behrends | H02S 50/10 324/537 |
| 2017/0302165 A1* | 10/2017 | Marcinkiewicz | H02M 7/06 |
| 2017/0356939 A1* | 12/2017 | Hurwitz | G01R 25/005 |
| 2020/0028349 A1* | 1/2020 | Elliott | H02H 1/0015 |

FOREIGN PATENT DOCUMENTS

| | | |
|---|---|---|
| EP | 3385681 A1 | 10/2018 |
| GB | 2498370 A | 7/2013 |
| JP | H0548153 A | 2/1993 |

OTHER PUBLICATIONS

European Search Report for Application No. 19212843.7, dated Jul. 13, 2020, 9 pages.

* cited by examiner

*Primary Examiner* — Jermele M Hollington
*Assistant Examiner* — Temilade S Rhodes-Vivour
(74) *Attorney, Agent, or Firm* — Cantor Colburn LLP

(57) ABSTRACT

Disclosed is an aircraft sensor fault detection system. The system includes a sensor system having a sensing apparatus to measure a parameter of an environment and a measurement circuit coupled to the sensing apparatus. The system includes a source of alternating current connected to the sensor system. The system further includes an alternating current measurement system that measures alternating current passing through the sensor system and indicates an error when a threshold based on a change in impedance of the sensing apparatus is exceeded.

20 Claims, 3 Drawing Sheets

REDUCED ERROR SENSOR FAULT DETECTION

BACKGROUND

Exemplary embodiments pertain to the art of error reduction for aircraft sensors having fault detection.

Sensors are prone to measurement failure or measurement accuracy reduction. Such fault conditions may not always be conspicuous. To detect error conditions, sensors may be subjected to non-destructive testing. Current testing may, however, increase sensor measurement error and uncertainty.

BRIEF DESCRIPTION

Disclosed is an aircraft sensor fault detection system. The system includes a sensor system having a sensing apparatus to measure a parameter of an environment and a measurement circuit coupled to the sensing apparatus. The system includes a source of alternating current connected to the sensor system. The system further includes an alternating current measurement system that measures alternating current passing through the sensor system and indicates an error when a threshold based on a change in impedance of the sensing apparatus is exceeded.

In addition to one or more of the features described above, or as an alternative, further embodiments may include that the source of alternating current is reduced by a capacitor before passing through the sensor system.

In addition to one or more of the features described above, or as an alternative, further embodiments may include that the sensing apparatus is a thermocouple.

In addition to one or more of the features described above, or as an alternative, further embodiments may include that the alternating current measurement system includes a high pass frequency filter having a cutoff frequency that is less than a frequency of alternating current from the source.

In addition to one or more of the features described above, or as an alternative, further embodiments may include that the cutoff frequency is 1 Hz.

In addition to one or more of the features described above, or as an alternative, further embodiments may include that the threshold is based on a predetermined magnitude of alternating current from the source passing through the sensor system.

In addition to one or more of the features described above, or as an alternative, further embodiments may include that the alternating current measurement system further includes a rectifier disposed to rectify alternating current from the source.

In addition to one or more of the features described above, or as an alternative, further embodiments may include that the error is indicated when a maximum magnitude of the rectified alternating current is greater than the predetermined magnitude.

In addition to one or more of the features described above, or as an alternative, further embodiments may include that the error is indicated when a maximum magnitude of the rectified alternating current is less than the predetermined magnitude.

Also disclosed is an aircraft sensor fault detection system. The system includes a sensor system having a thermocouple to measure a temperature of an environment and a measurement circuit coupled to the thermocouple to measure a direct voltage generated by the thermocouple. The system includes a source of alternating current connected to the sensor system. The system includes an alternating current measurement system that measures alternating current passing through the sensor system as a rectified and smoothed direct current isolated from the direct voltage generated by the thermocouple. The alternating current measurement system also indicates an error when a threshold based on a change in impedance of the sensor system is exceeded.

In addition to one or more of the features described above, or as an alternative, further embodiments may include that the alternating current from the source is reduced by a capacitor before passing through the sensor system.

In addition to one or more of the features described above, or as an alternative, further embodiments may include that the alternating current measurement system includes a high pass frequency filter having a cutoff frequency that is less than a frequency of alternating current from the source.

In addition to one or more of the features described above, or as an alternative, further embodiments may include that the cutoff frequency is 1 Hz.

In addition to one or more of the features described above, or as an alternative, further embodiments may include that the threshold is based on a predetermined maximum magnitude of alternating current passing through the sensor system.

In addition to one or more of the features described above, or as an alternative, further embodiments may include that the error is indicated when a maximum magnitude of the rectified alternating current is greater than the predetermined maximum magnitude.

In addition to one or more of the features described above, or as an alternative, further embodiments may include that the error is indicated when a maximum magnitude of the rectified alternating current is less than the predetermined maximum magnitude.

Also disclosed is a method of detecting a fault in an aircraft sensor system. The method includes driving an alternating current through a sensing system including a sensing apparatus to measure a parameter of an environment and a measurement circuit coupled to the sensing apparatus. The method further includes separating a direct current associated with the sensing system from the alternating current. The method also includes rectifying the alternating current. The method includes comparing a feature of the rectified alternating current with a predetermined threshold based on the alternating current. The method includes outputting an error based on the comparison. The method includes operating an aircraft according to the error.

In addition to one or more of the features described above, or as an alternative, further embodiments may include that the feature is a maximum magnitude of the rectified alternating current.

In addition to one or more of the features described above, or as an alternative, further embodiments may include reducing the alternating current by a capacitor before entering the sensing system.

In addition to one or more of the features described above, or as an alternative, further embodiments may include smoothing the rectified alternating current.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Sensor apparatuses may be used to determine various environmental parameters. As a brief example, thermocouples and resistance temperature devices (RTD) may be used to measure a temperature of the environment. Differential pressure devices may be used to measure pressure, fluid flow, or fluid levels. Linear variable differential transformers may be used to measure position.

A known non-destructive error detection for such devices may include application of a direct current across a sensor apparatus. The added direct current may, however, increase the error or uncertainty of the sensor apparatus for devices that measure parameter changes in the environment through direct current or that have a direct current component. As such, the direct current may be reduced, though not eliminated, to a trickle by resistors or other implements to limit the error caused.

Additionally or alternatively, application of an alternating current through the measurement circuit may provide error identification with less impact on measurement error or uncertainty. For example, alternating current through portions of the measurement circuit may indicate corrosion, contamination, breakage, oxidation, and other error-causing operating conditions. A filter may be used to separate the direct current components from alternating current components such that parameter measurement and error measurement can be performed. For example, a high-pass or band pass frequency filter may be used to isolate the alternating current. After isolation, the alternating current may be converted to direct current through rectification and smoothing. As such, deviation from a direct current or voltage threshold could provide detection of error-causing conditions without imposing substantial measurement errors.

Figure 1:
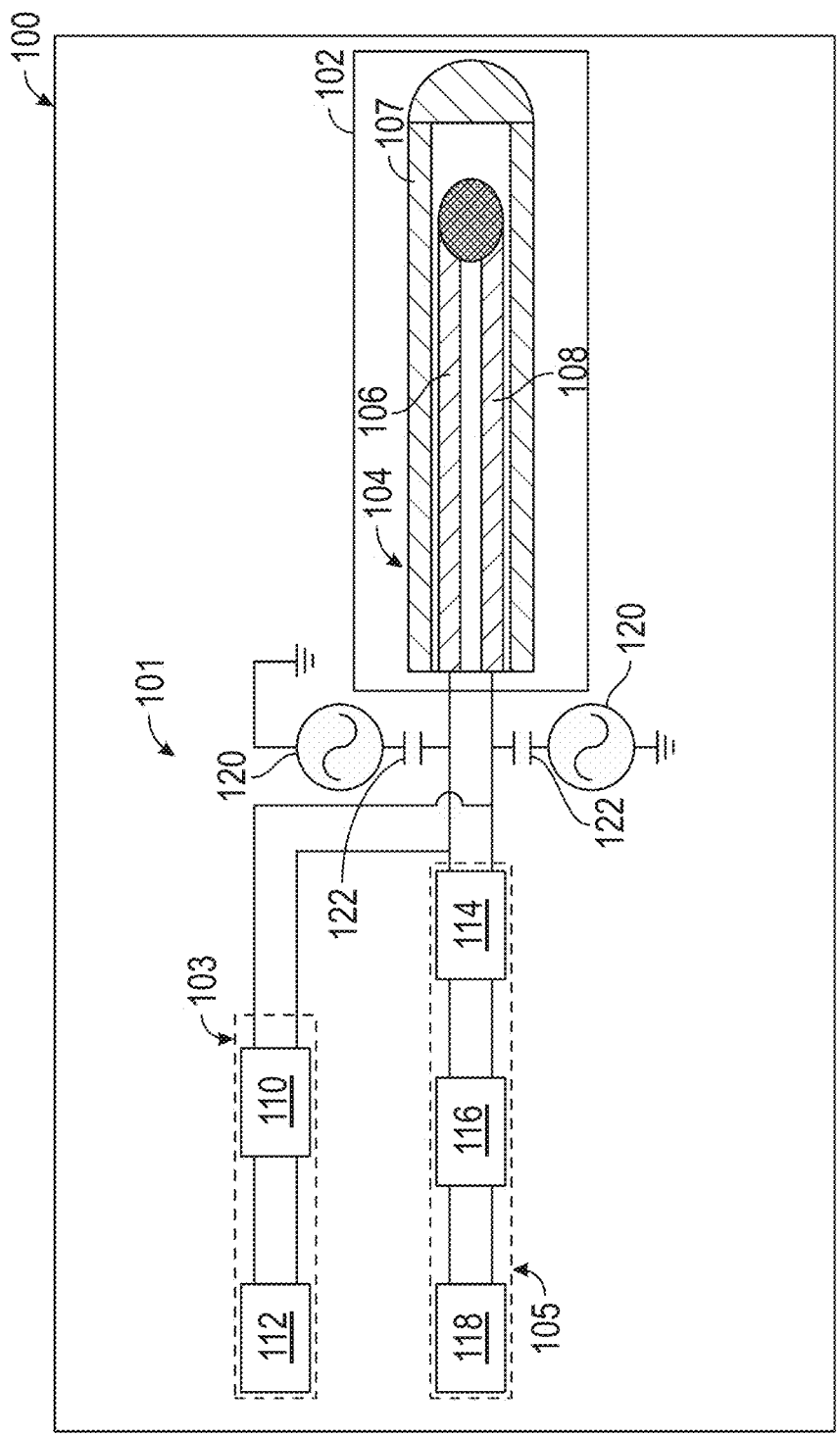
FIG. 1 is an aircraft sensor fault detection system having an alternating current source.

Referring to FIG. 1, an aircraft 100, is generally shown. The aircraft 100 includes a sensor system 101. The sensor system 101 includes a sensing apparatus 102. The sensing apparatus 102 may be a thermocouple 104 or any other type of sensor, or portion thereof, discussed or not discussed. As shown, the thermocouple 104 has disparate conductors 106, 108 defining a portion of a measurement circuit 103 connected to measurement instrumentation 110, 112 such that a voltage generated by the disparate conductors 106, 108 is measured by the measurement instrumentation 110, 112. The measurement circuit may include at least the sensing apparatus 102, and the measurement instrumentation 110, 112.

The disparate conductors 106, 108 generate a voltage based on a temperature of the environment of the aircraft 100. The environment may be any enclosed or open area having parameters that can be sensed. The parameter may be any property that can be determined based on the sensor apparatus 102. As a brief example, the parameter may be temperature, pressure, mass, weight, position, or velocity.

In the embodiment shown in FIG. 1, sources of alternating current 120 are connected to the sensor system 101. The source of alternating current 120 may be configured to flow through the sensing apparatus 102 and the rest of measurement circuit 103, or a portion thereof. The sources 120 may be phase offset to produce minimal direct current across the sensor 102. The sources 120 may be 180° out of phase. The alternating current sources 120 may form a circuit through either the measurement apparatus 103, the alternating current measurement apparatus 105, or both. Additionally, the measurement apparatus 103 and the alternating current measurement apparatus 105 may be have a common ground with the alternating current sources 120.

As one connective example, the alternating current may be connected in parallel-type configuration such that alternating current flows through the sensor to the alternating current measurement system. As such, error conditions within the sensing apparatus 102 or portions of the measurement circuit 103 will change the alternating current that flows through such portions. Any type of series or parallel configuration may be used such that the alternating current 120 flows through portions of the sensing apparatus 102 and portion of the measurement circuit 103. It should be appreciated that the precise position of where the measurement circuit 103 and the sensing apparatus 102 circuits begin and end are fluid in that they may overlap, comingle, or occupy the same or similar wiring. That is, the distinction between the measurement circuit 103 and the sensor apparatus 102 are immaterial in that portions of the measurement circuit 103, the sensor apparatus 102 and the alternating current measurement circuit 105 overlap, comingle, and join to allow for measurement of the alternating current through a portion of the measurement apparatus 103 and the sensor 102.

The alternating current 120 may be reduced by a capacitor 122 such that a trickle alternating current is formed. The trickle alternating current may impose less measurement error than the full alternating current 120. In one embodiment, the trickle AC current can be applied through the outputs of the sensor 102. In the embodiment shown in FIG. 1, this can mean that the AC current is applied through the disparate conductors 106, 108. If the impedance of the disparate conductors 106, 108 changes or the measurement circuit 103 changes, the alternating current through the measurement circuit 103 and the sensor apparatus 102 will deviate from the source alternating current 120 in magnitude, phase, frequency, or any other electrical characteristic. The alternating current measurement system 105 may measure these changes to detect that a fault has occurred or that the sensing apparatus 102 or measurement circuit 103 has deteriorated.

To maintain accurate parameter readings of the environment the alternating current 120 is prevented from reaching the measurement circuit 103, with a frequency filter 110. For example, a low-pass filter 110 may be implemented. The low-pass filter 110 ensures that only direct current or pseudo direct current reaches the measurement instrumentation 112. The low pass filter may be, for example, a choke. That is, only direct current provided by the thermocouple or amplification thereof is measured by the measurement instrumentation 112.

Similarly, the alternating current measurement circuit 105 isolates the potentially transformed alternating current after traversing a portion of the measurement circuit 103. The alternating current measurement system 105 includes a high-pass filter 114 for isolating the alternating current from the measurement circuit 103. The high-pass filter may have a cutoff or corner frequency that is less than a frequency of the alternating current 120. For example, the cutoff frequency may be 1 Hz. The filter may also be a pass band filter configured to pass only frequencies associated with the alternating current 120 to remove any extraneous noise in the signal. After isolation by the high-pass filter 114, the alternating current measurement system may be configured to rectify and smooth the alternating current by a rectification and smoothing circuit 116. For example, a full-wave rectifier may be implemented with a capacitor to convert the alternating current to direct current. Other types of rectifiers may be used (e.g., half-wave) and adjustments to the indication thresholds of the comparator 118 may be adjusted commensurately. The thresholds may be set based on a maximum magnitude of the rectified and smoothed alternating current 102. For example, the threshold may be based on a peak value, root mean squared value, or saddle value if the smoothing does not remove all of the oscillations from the source of alternating current 102.

The comparator 118 may include a threshold or predetermined threshold that is defined based on expected faults and errors. For example, the measurement circuit 103 may have a static predetermined magnitude of change to the alternating current 102, and corrosion may impart known impedance to the alternating current. Using these known values, a threshold may be set to determine when corrosion or a known quantity of corrosion is occurring on the sensor apparatus 102. As such, any fault condition may be detected through observation of the affects to the alternating current signal. One or more thresholds may be used to identify the specific fault condition occurring. The thresholds may be set to identify different fault conditions that are above or below the steady state signal.

The detection of a fault may cause vehicle controllers to adjust the control of the vehicle 100. For example, if temperatures are unreliable, an aircraft controller may operate an air conditioning system or the aircraft controller may operate the aircraft in a cautious mode.

Figure 2A:
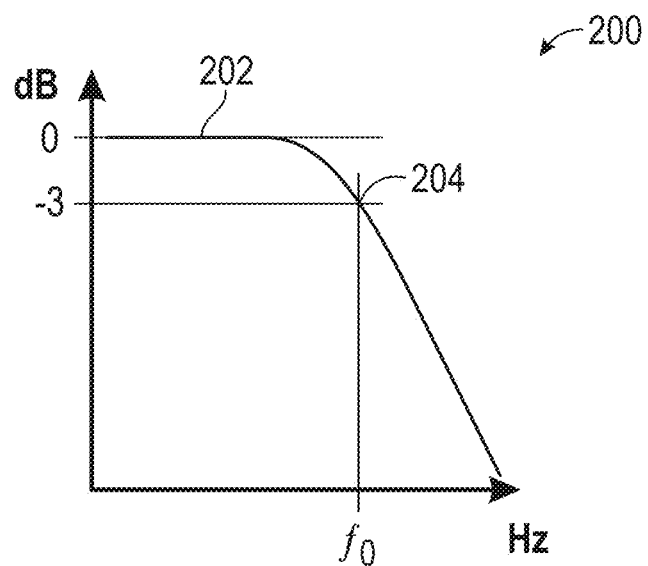
FIG. 2A is a Bode plot of frequency response for a low pass frequency filter.
Figure 2B:
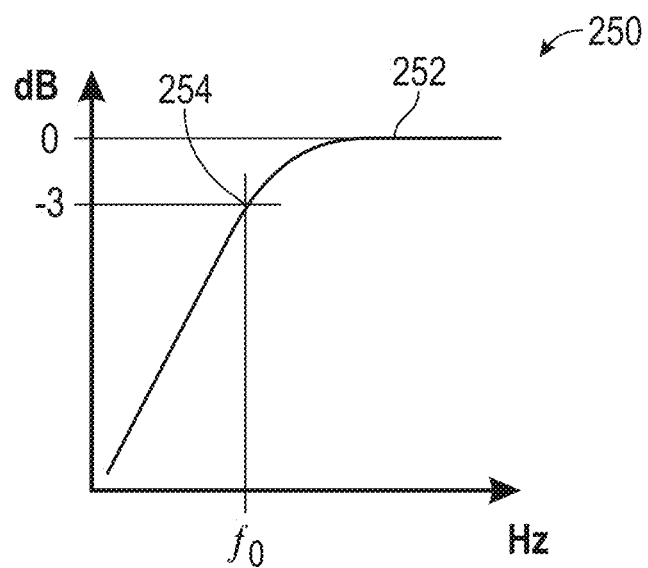
FIG. 2B is a Bode plot of frequency response for a high pass frequency filter.

Referring to FIGS. 2A-2B, Bode plots 200, 250 showing frequency response for respective low pass and high pass frequency filters are shown. Bode plot 200 includes a contour 202 of allowed frequencies in Hz along the horizontal axis. The Bode plot 200 shows power reduction of −3 dB at the corner or cutoff frequency 204 along the vertical axis. The cutoff frequency 204 is the division between the pass frequencies and the stop frequencies. The cutoff frequency for the low pass frequency filter as shown in Bode plot 200 could be 1 Hz. Bode plot 250 includes a contour 252 of allowed frequencies in Hz along the horizontal axis. The Bode plot 200 shows power reduction of −3 dB at the corner or cutoff frequency 254 along the vertical axis. The cutoff frequency for the high pass frequency filter as shown in Bode plot 250 could similarly be 1 Hz. The pass frequency may also be a band (not shown) as a concave combination of the high pass and low pass frequency filters.

Figure 3:
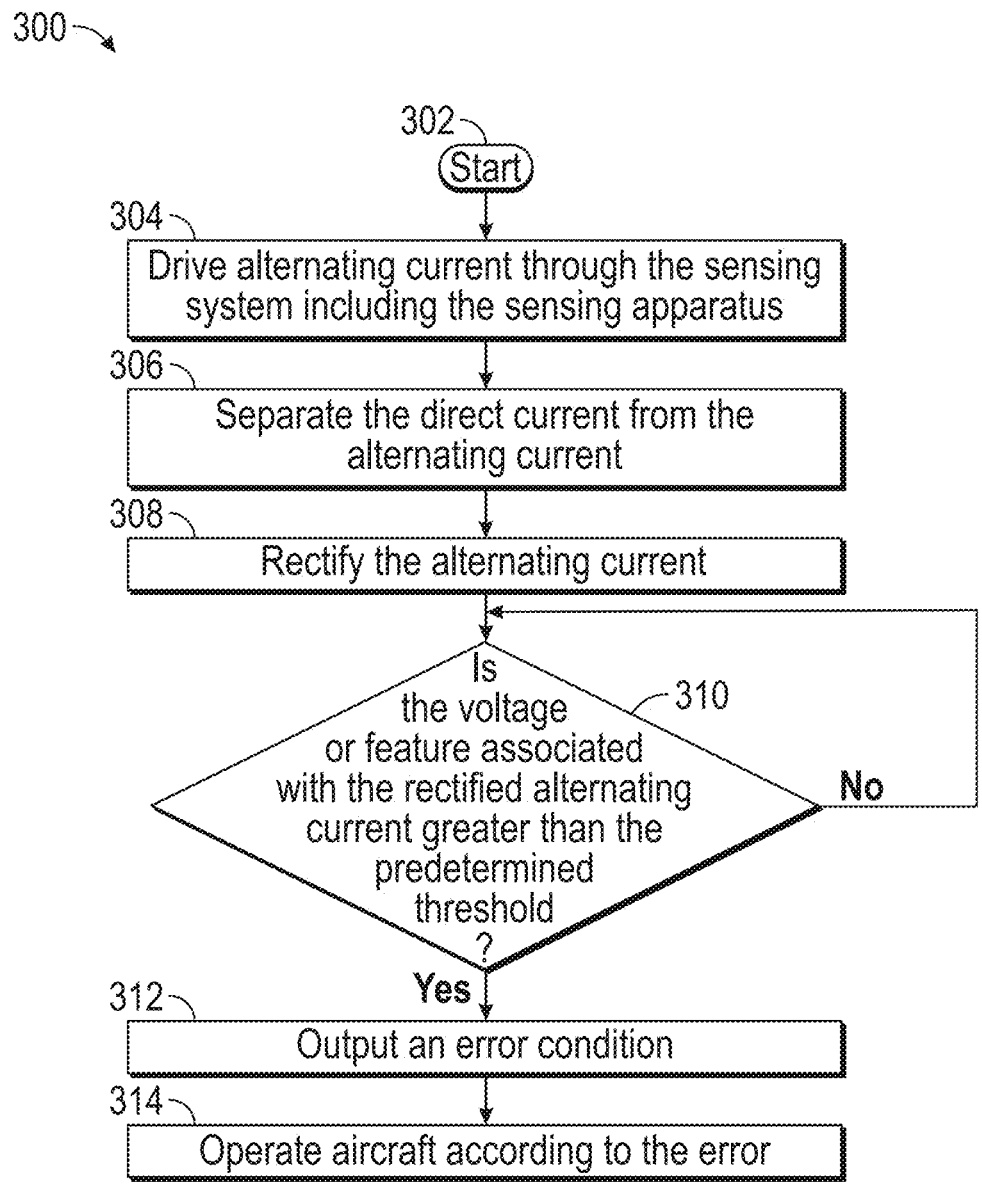
FIG. 3 is a method for performing portions of this disclosure.

Referring to FIG. 3, a method 300 is shown. The method 300 starts in step 302. In step 304, current is driven through the sensing system 101 including the sensing apparatus 102. In step 306, the direct current is separated from the alternating current by a filter 114. In step 308, the alternating current is rectified by a rectifier 116. In step 310, a controller, operational amplifier, comparator, or other implement of the alternating current measurement system 105 determines whether the rectified alternating current is above the predetermined threshold. In step 312, if true, an output condition is presented to an operator or control system to indicate an error. In step 314, the aircraft is operated according to error.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An aircraft sensor fault detection system, the system comprising:
   a sensor system including a sensing apparatus to measure a parameter of an environment and a measurement circuit coupled to the sensing apparatus;
   a first source of alternating current connected to a first conductor of the sensor system;
   a second source of alternating current connected to a second conductor of the sensor system, the second source of alternating current being 180 degrees out of phase with the first source of alternating current; and
   an alternating current measurement system arranged to measure alternating current from the first source and the second source passing through the sensor system, the alternating current being changed by a change in impedance of the first conductor or the second conductor, and to indicate an error based on the change in impedance, indicated by the alternating current, exceeding a threshold.

2. The aircraft sensor fault detection system of claim 1, wherein the alternating current measurement system includes a first capacitor to reduce the alternating current from the first source of alternating current before passing through the sensor system and a second capacitor to reduce the alternating current from the second source of alternating current before passing through the sensor system.

3. The aircraft sensor fault detection system of claim 1, wherein the sensing apparatus is a thermocouple.

4. The aircraft sensor fault detection system of claim 1, wherein the alternating current measurement system includes a high pass frequency filter having a cutoff frequency that is less than a frequency of alternating current from the first source and the second source.

5. The aircraft sensor fault detection system of claim 4, wherein the cutoff frequency is 1 Hz.

6. The aircraft sensor fault detection system of claim 1, wherein the threshold is based on a predetermined magnitude of alternating current from the first source and the second source passing through the sensor system.

7. The aircraft sensor fault detection system of claim 6, wherein the alternating current measurement system further includes a rectifier disposed to rectify the alternating current.

8. The aircraft sensor fault detection system of claim 7, wherein the alternating current measurement system indicates an error when a maximum magnitude of the rectified alternating current is greater than the predetermined magnitude.

9. The aircraft sensor fault detection system of claim 7, wherein the alternating current measurement system indicates an error when a maximum magnitude of the rectified alternating current is less than the predetermined magnitude.

10. An aircraft sensor fault detection system, the system comprising:
a sensor system including a thermocouple to measure a temperature of an environment and a measurement circuit coupled to the thermocouple to measure a direct voltage generated by the thermocouple;
a first source of alternating current connected to a first conductor of the sensor system;
a second source, 180 degrees out of phase with the first source, connected to a second conductor of the sensor system; and
an alternating current measurement system arranged to measure alternating current from the first source and the second source passing through the sensor system as a rectified and smoothed direct current isolated from the direct voltage generated by the thermocouple, and to indicate an error when a threshold based on a change in impedance of the sensor system is exceeded.

11. The aircraft sensor fault detection system of claim 10, wherein alternating current from the first source and the second source is reduced by a capacitor before passing through the sensor system.

12. The aircraft sensor fault detection system of claim 10, wherein the alternating current measurement system includes a high pass frequency filter having a cutoff frequency that is less than a frequency of alternating current from the first source and the second source.

13. The aircraft sensor fault detection system of claim 12, wherein the cutoff frequency is 1 Hz.

14. The aircraft sensor fault detection system of claim 10, wherein the threshold is based on a predetermined maximum magnitude of alternating current passing through the sensor system.

15. The aircraft sensor fault detection system of claim 14, wherein the error is indicated when a maximum magnitude of the rectified alternating current is greater than the predetermined maximum magnitude.

16. The aircraft sensor fault detection system of claim 14, wherein the alternating current measurement system indicates the error when a maximum magnitude of the rectified alternating current is less than the predetermined maximum magnitude.

17. A method of detecting a fault in an aircraft sensor system, the method comprising:
driving an alternating current through a sensing system including a sensing apparatus from a first source connected to a first conductor of the sensing apparatus and from a second source, 180 degrees out of phase with the first source, connected to a second conductor of the sensing apparatus, the sensing apparatus measuring a parameter of an environment and a measurement circuit coupled to the sensing apparatus;
separating a direct current associated with the sensing system from the alternating current;
rectifying the alternating current;
comparing a feature of the rectified alternating current with a predetermined threshold based on the alternating current;
outputting an error based on the comparison; and
operating an aircraft according to the error.

18. The method of claim 17, wherein the feature is a maximum magnitude of the rectified alternating current.

19. The method of claim 17 further comprising, reducing the alternating current by a capacitor before entering the sensing system.

20. The method of claim 17 further comprising smoothing the rectified alternating current.

* * * * *